US008447041B2

(12) United States Patent
Asada et al.

(10) Patent No.: US 8,447,041 B2
(45) Date of Patent: May 21, 2013

(54) AUDIO OUTPUT APPARATUS, AUDIO OUTPUT METHOD, AUDIO OUTPUT SYSTEM, AND PROGRAM FOR AUDIO OUTPUT PROCESSING

(75) Inventors: Kohei Asada, Kanagawa (JP); Hiroki Kawanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 1172 days.

(21) Appl. No.: 11/936,882

(22) Filed: Nov. 8, 2007

(65) Prior Publication Data

US 2008/0152169 A1 Jun. 26, 2008

(30) Foreign Application Priority Data

Dec. 25, 2006 (JP) ................................ 2006-347107

(51) Int. Cl.
*H04R 29/00* (2006.01)
*H04R 1/10* (2006.01)
*H03G 3/20* (2006.01)
*H03G 3/00* (2006.01)
*H04B 15/00* (2006.01)

(52) U.S. Cl.
USPC ................ 381/56; 381/57; 381/74; 381/94.1; 381/104; 381/107

(58) Field of Classification Search
USPC ................. 381/74, 56–58, 83, 93, 94.3, 94.1, 381/104, 107, 73.1
See application file for complete search history.

(56) References Cited

U.S. PATENT DOCUMENTS 5,412,733 A * 5/1995 Nagayoshi et al. ............ 381/74
5,537,668 A 7/1996 Nambu et al.
2003/0002688 A1* 1/2003 Kanevsky et al. .............. 381/74
2004/0196992 A1* 10/2004 Ryan ............................ 381/312
2006/0262938 A1* 11/2006 Gauger et al. ................. 381/56

(Continued)

FOREIGN PATENT DOCUMENTS

CN 1152830 A 6/1997
CN 1802034 A 7/2006

(Continued)

OTHER PUBLICATIONS

U.S. Appl. No. 11/936,894, filed Nov. 8, 2007, Asada, et al.

(Continued)

*Primary Examiner* — Xu Mei
*Assistant Examiner* — David Ton
(74) *Attorney, Agent, or Firm* — Oblon, Spivak, McClelland, Maier & Neustadt, L.L.P.

(57) ABSTRACT

An electricity-to-sound converter reproduces a sound according to a first audio signal. A sound collector outputs a second audio signal. A first frequency band limit filter filters the second audio signal. A sound leakage evaluating block evaluates a leakage of a sound reproduced by the electricity-to-sound converter on the basis of the first audio signal and the filtered second audio signal. A multiplier multiples the first audio signal by a coefficient approximating a transmission characteristic between the electricity-to-sound converter and the sound collector when the sound reproduced by the electricity-to-sound converter leaks outside a housing to be picked up by the sound collector. A second frequency band limit filter filters the multiplied first audio signal and supplies the filtered first audio signal to the sound leakage evaluating block. The first frequency band limit filter and the second frequency band limit filter have passing bands of 1 kHz to 3 kHz.

19 Claims, 9 Drawing Sheets

U.S. PATENT DOCUMENTS

| | | | | |
|---|---|---|---|---|
| 2007/0253569 | A1 * | 11/2007 | Bose | 381/71.6 |
| 2008/0095385 | A1 * | 4/2008 | Tourwe | 381/107 |
| 2009/0092265 | A1 * | 4/2009 | Lovejoy | 381/107 |
| 2009/0232321 | A1 * | 9/2009 | Ohta et al. | 381/61 |

FOREIGN PATENT DOCUMENTS

| | | | |
|---|---|---|---|
| EP | 1 465 454 | A2 | 10/2004 |
| GB | 2 311 186 | A | 9/1997 |
| JP | 3-247098 | | 11/1991 |
| JP | 4-123598 | | 4/1992 |
| JP | 04123598 | A * | 4/1992 |
| JP | 4-278796 | | 10/1992 |
| JP | 5-49091 | | 2/1993 |
| JP | 6-6156 | | 1/1994 |
| JP | 8-307986 | | 11/1996 |
| JP | 10-56346 | | 2/1998 |
| JP | 2000-59876 | | 2/2000 |
| JP | 2000-134698 | | 5/2000 |
| JP | 2000-190785 | | 7/2000 |
| JP | 2001-136039 | | 5/2001 |
| JP | 2005-223445 | | 8/2005 |
| JP | 2007-43231 | | 2/2007 |

OTHER PUBLICATIONS

U.S. Appl. No. 11/865,419, filed Oct. 1, 2007, Asada, et al.
U.S. Appl. No. 11/865,354, filed Oct. 1, 2007, Asada.
U.S. Appl. No. 11/868,815, filed Oct. 8, 2007, Itabashi, et al.
U.S. Appl. No. 11/875,374, filed Oct. 19, 2007, Asada.
U.S. Appl. No. 11/936,876, filed Nov. 8, 2007, Asada, et al.
U.S. Appl. No. 11/952,468, filed Dec. 7, 2007, Asada, et al.
U.S. Appl. No. 11/966,168, filed Dec. 28, 2007, Ohkuri, et al.
U.S. Appl. No. 11/966,452, filed Dec. 28, 2007, Itabashi, et al.
U.S. Appl. No. 12/015,824, filed Jan. 17, 2008, Asada, et al.
Extended European Search Report issued Jun. 16, 2011, in Patent Application No. 07123624.4.
Office Action issued Dec. 13, 2011, in Japanese Patent Application No. 2006-347107.
Office Action issued Nov. 6, 2012 in Japanese Application No. 2006-347107.
Chinese Office Action dated Nov. 12, 2010, for Chinese Patent Application No. 200710159878.
Chinese Office Action dated May 20, 2011, for Chinese Patent Application No. 200710159878.

* cited by examiner

AUDIO OUTPUT APPARATUS, AUDIO OUTPUT METHOD, AUDIO OUTPUT SYSTEM, AND PROGRAM FOR AUDIO OUTPUT PROCESSING

CROSS REFERENCES TO RELATED APPLICATIONS

The present invention contains subject matter related to Japanese Patent Application JP 2006-347107 filed in the Japan Patent Office on Dec. 25, 2006, the entire contents of which being incorporated herein by reference.

BACKGROUND OF THE INVENTION

1. Field of the Invention

The present invention relates to an audio output apparatus, such as a headphone device and a mobile telephone terminal. The present invention also relates to an audio output method and an audio output processing program configured for use in the above-mentioned apparatus. The present invention still relates to an audio output system composed of a headphone device and an audio output device.

2. Description of the Related Art

For example, in reproducing an audio signal for listening in a portable audio player, a headphone or an earphone is generally used to prevent sound from being leaked outside.

These days, the sound leaked from the headphone worn in cars is presenting a social concern as a so-called noise pollution. This sound leakage out of the headphone often occurs when the listener sets a comparatively high reproduction sound volume to the player for listening.

Proposed to overcome this problem are a technique in which the maximum volume is suppressed on the audio player side and a technique in which the reproduction volume is suppressed by compressor processing or a limiter processing (refer to Japanese Patent No. 3016446 (Japanese Patent Laid-open No. Hei 05-49091), hereinafter referred to as Patent Document 1), for example.

SUMMARY OF THE INVENTION

However, if the audio player has neither the compressor processing function nor the limiter processing function as disclosed in Patent Document 1 above, it is difficult to basically overcome the noise-pollution problem unless the listener himself lowers the sound volume of the audio player to a non-nuisance level.

Raising the sound volume of the audio player by the listener is often practiced in a noisy listening environment. In such a case, because the listening environment itself is noisy, a relatively large sound leakage from the audio player would not give much sound nuisance to surrounding people.

However, if the listener moves from the above-mentioned noisy environment to a less noisy environment with the audio player left set to the high sound level, the listener, while listening, is often unaware that the listener has moved into the less noisy environment. If this happens, even if the sound leakage from the audio player is relatively low, it may give public nuisance without the listener's intention.

Therefore, the present invention addresses the above-identified and other problems associated with related-art methods and apparatuses and solves the addressed problems by providing an audio output apparatus and method according to embodiments of the present invention.

In carrying out the invention and according to one embodiment of the present invention, there is provided an audio output apparatus. This audio output apparatus includes an electricity-to-sound converter, a sound collector, a sound leakage evaluating block, and a controller. The electricity-to-sound converter is arranged in a housing and configured to reproduce a first audio signal. The sound collector (or a microphone) is configured to pick up sound outside the housing and output a second audio signal. The sound leakage evaluating block is configured to evaluate leakage of a sound reproduced by the electricity-to-sound converter into outside of the housing on the basis of the first audio signal and the second audio signal. The controller is configured to execute predetermined processing on the basis of a result of the evaluation made by the sound leakage evaluating block.

In the above-mentioned audio output apparatus, the controller suppresses the leakage into the outside of the housing of the sound reproduced by the electricity-to-sound converter from the first audio signal.

In the above-mentioned audio output apparatus, the controller gives an alarm to a listener of the sound on the basis of a result of the evaluation made by the sound leakage evaluating block.

In the above-mentioned audio output apparatus, the sound leakage evaluating block makes a comparison between the first audio signal and the second audio signal to determine a correlation between these signals and evaluate sound leakage from the housing on the basis of a result of the correlation determination.

In the above-mentioned audio output apparatus, the sound leakage evaluating block has a correlation value calculating block configured to calculate a correlation value between the first audio signal and the second audio signal and a correlation decision block configured to decide a sound leaking outside the housing on the basis of the correlation value.

In the above-mentioned audio output apparatus, the sound leakage evaluating block obtains a difference between the first audio signal and the second audio signal to evaluate a sound leaking outside the housing on the basis of the obtained difference.

In the above-mentioned audio output apparatus, the sound leakage evaluating block converts the first audio signal and the second audio signal in a time domain into a third signal and a fourth signal in a frequency domain and makes a comparison between the third signal and the fourth signal to evaluate a sound leaking outside the housing.

In the above-mentioned audio output apparatus, the second audio signal is supplied to the sound leakage evaluating block through a multiplier that multiplies the second audio signal by a coefficient corresponding to a transmission characteristic from between the electricity-to-sound converter and the sound collector at the time when a sound reproduced and outputted by the electricity-to-sound converter leaks outside the housing to be picked up by the sound collector.

In the above-mentioned audio output apparatus, the controller lowers sound reproduction volume of the first audio signal.

In the above-mentioned audio output apparatus, the controller executes at least one of compressor processing and limiter processing on the first audio signal by defining an upper limit of the processing.

In the above-mentioned audio output apparatus, the sound leakage evaluating block executes the evaluation when at least one of an instantaneous amplitude value and an energy value of at least one of the first audio signal and the second audio signal has been exceeded.

In the above-mentioned audio output apparatus, the sound leakage evaluating block executes the evaluation when, by executing a frequency analysis on at least one of the first audio signal and the second audio signal, a resultant frequency amplitude value has exceeded a predetermined level.

In the above-mentioned audio output apparatus, the sound leakage evaluating block executes the evaluation when at least one of an instantaneous amplitude value and an energy value of at least one of the first audio signal and the second audio signal has been exceeded and when, by executing a frequency analysis on at least one of the first audio signal and the second audio signal, a resultant frequency amplitude value has exceeded a predetermined level.

The above-mentioned audio output apparatus further includes a noise reducer configured to generate a noise reduction audio signal for reducing noise outside the housing from the second audio signal picked up by the sound collector and add the generated noise reduction audio signal to the second audio signal.

In carrying out the invention and according to another embodiment of the present invention, there is provided an audio output method. This audio output method includes the steps of: reproducing a first audio signal by an electricity-to-sound converter arranged in a housing; picking up a sound outside the housing by a sound collector to output a second audio signal; evaluating leakage of a sound reproduced by the electricity-to-sound converter into outside of the housing on the basis of the first audio signal and the second audio signal; and executing predetermined processing on the basis of a result of the evaluation.

In carrying out the invention and according to still another embodiment of the present invention, there is provided a recording media configured to record a computer-readable program. This program makes a computer execute the steps of: reproducing a first audio signal by an electricity-to-sound converter arranged in a housing; picking up a sound outside the housing by a sound collector to output a second audio signal; evaluating leakage of a sound reproduced by the electricity-to-sound converter into outside of the housing on the basis of the first audio signal and the second audio signal; and executing predetermined processing on the basis of a result of the evaluation.

In carrying out the invention and according to yet another embodiment of the present invention, there is provided an audio output system. This audio output system includes a headphone apparatus and an audio output apparatus to which the headphone apparatus is connected. The headphone apparatus includes an electricity-to-sound converter arranged in a housing of the headphone apparatus and configured to reproduce a first audio signal from supplied from the audio output apparatus and a sound collector configured to pick up sound outside the housing of the headphone apparatus. The audio output apparatus includes a sound leakage evaluating block configured to evaluate leakage of a sound reproduced by the electricity-to-sound converter into outside of the housing on the basis of the first audio signal to be supplied to the headphone apparatus and a second audio signal picked up by the sound collector and a controller configured to execute predetermined processing on the basis of a result of the sound leakage evaluation executed by the sound leakage evaluating block.

As described above and according to the embodiment of the invention, the sound leakage evaluating block evaluates sound leakage from the second audio signal supplied from the sound collector and the first audio signal reproduced and supplied by the electricity-to-sound converter. This novel configuration allows the evaluation that, if there is a high correlation between these two signals, there is a relatively large sound leakage; if there is a low correlation, there is a relatively small sound leakage, for example. Consequently, this novel configuration allows the proper sound leakage suppression by the controller and the presentation of a sound leakage warning to the listener, for example.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

This invention will be described in further detail by way of embodiments thereof with reference to the accompanying drawings.

First Embodiment of the Invention

Figure 1:
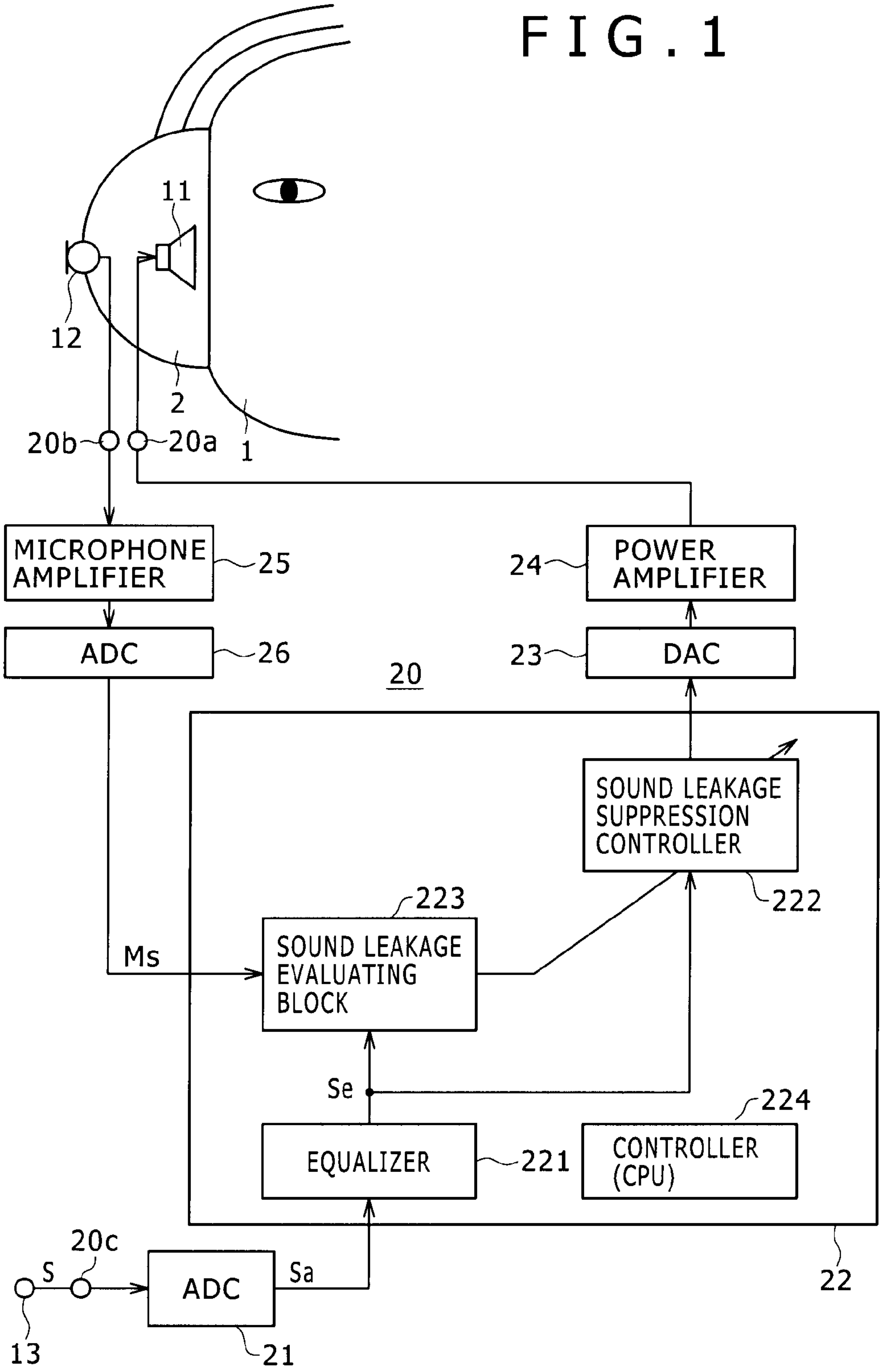
FIG. 1 is a block diagram illustrating an exemplary configuration of a first embodiment in which an audio output apparatus according to the first embodiment of the invention is applied to a headphone apparatus.

Now, referring to FIG. 1, there is shown a block diagram illustrating an exemplary configuration of a first embodiment of the invention in which an audio output apparatus according to the embodiment is applied to a headphone apparatus.

FIG. 1 shows a configuration of only the right-hand ear side of a listener 1 of a headphone apparatus. This also holds with other embodiments of headphone apparatuses to be described later. It should be noted that the left-hand side of the headphone apparatus has the same configuration as that of the right-hand side.

In FIG. 1, the listener 1, having worn the headphone apparatus of the embodiment, is covered in the right-hand ear of the listener 1 with a right-hand year headphone housing 2. Inside the headphone housing 2, a headphone driver unit (hereafter referred to simply as a driver) 11 is arranged as an electrical signal to sound conversion means configured to reproduce, in sound, an audio signal that is an electrical signal.

In the present embodiment, the headphone housing 2 is externally arranged with a microphone 12 as a sound pickup means (or a sound to electrical signal conversion means) so as to pick up sound around the listener 1 outside the headphone housing 2.

An audio signal input terminal 13 is a terminal section into which audio signal S to be listened is inputted. The audio signal input terminal 13 is made up of a headphone plug that is inserted into a headphone jack of a portable music player, for example. In the present embodiment, on an audio signal transmission path between the audio signal input terminal 13, the driver 11, and the microphone 12, an audio signal processor 20 having an A/D converter 21, a DSP (Digital Signal Processor) 22, a D/A converter 23, a power amplifier 24, a microphone amplifier 25, and an A/D converter 26 is arranged.

Although not shown, the audio signal processor 20 is connected to the driver 11 and the microphone 12 and the headphone plug configuring the audio signal input terminal 13 with connection cables. Reference symbols 20*a*, 20*b*, and 20*c* denote connection terminals to which connection cables are connected for the audio signal processor 20.

An audio signal S entered from a portable music player through the audio signal input terminal 13 is converted by the A/D converter 21 into a digital audio signal Sa to be supplied to the DSP 22.

In this example, the DSP 22 has a digital equalizer 221, a sound leakage suppression controller 222, and a controller 224 having a CPU. A digital signal Sa from the A/D converter 21 is supplied to the digital equalizer 221 to be corrected in sound characteristic, such as amplitude-frequency characteristic correction or phase-frequency characteristic correction or both.

A sound signal Se from the digital equalizer 221 is supplied to the sound leakage suppression controller 222 and a sound leakage evaluating block 223.

In the present embodiment, the sound leakage suppression controller 222 lowers the sound volume of the audio signal Se to a predetermined specified level, if there is a sound leakage, on the basis of a control signal supplied from the sound leakage evaluating block 223; if there is no sound leakage, the output sound volume of the audio signal Se is left unchanged.

The digital audio signal from the sound leakage suppression controller 222 is supplied to the D/A converter 23 to be converted into an analog audio signal, which is supplied to the driver 11 through the power amplifier 24 to be reproduced in sound.

On the other hand, an audio signal picked up by the microphone 12 is supplied to the A/D converter 26 through the microphone amplifier 25 to be converted into a digital audio signal Ms, which is supplied to the sound leakage evaluating block 223 of the DSP 22.

The sound leakage evaluating block 223 makes a comparison between the digital signal Se supplied from the digital equalizer 221 and the digital audio signal Ms supplied from the A/D converter 26 to check for a correlation therebetween, thereby evaluating a sound leakage as a decision result.

Next, if a correlation is found between the digital audio signal Se and the digital audio signal Ms, the sound leakage evaluating block 223 determines that there is a sound leakage, thereby supplying a control signal to the sound leakage suppression controller 222, specifying the lowering of the sound volume by a specified level. If no correlation is found between these digital audio signals, the sound leakage evaluating block 223 determines that there is no sound leakage, supplying a control signal to the sound leakage suppression controller 222, specifying that the output sound volume be left unchanged.

Consequently, if a sound leakage is recognized by the sound leakage evaluating block 223, then the sound leakage suppression controller 222 automatically reduces the sound volume of the audio signal Se to be supplied to the driver 11, thereby suppressing sound leakage.

In the present embodiment, sound leakage evaluating block 223 does not normally executes a sound leakage evaluation processing; but, in consideration of a change in listening environment for example, the sound leakage evaluating block 223 is started upon detection of the following timing by the controller 224, thereby starting sound leakage evaluation processing.

(Timing 1)

When the plug (corresponding to the audio signal input terminal 13) of the headphone apparatus is inserted in the headphone jack of the portable music player, supplying a power voltage to the DSP 22 from the portable music player, and the rising edge of this power voltage is detected by the controller 224 having a CPU, the controller 224 starts up the sound leakage evaluating block 223.

(Timing 2)

In the DSP 22, the CPU of the controller 224 counts the internal clock to count a predetermined elapsed time and the controller 224 starts up the sound leakage evaluating block 223 every time this predetermined time passes.

(Timing 3)

Although not shown, the DSP 22 contains a detecting circuit configured to detect an instantaneous amplitude value or an energy value of time waveform of each of a digital audio signal Ms and a digital audio signal Se and a decision circuit configured to make a decision whether the instantaneous amplitude value or energy value outputted from the detecting circuit has gone over a predetermined threshold. The CPU monitors the outputs of the decision circuit. When the instantaneous amplitude value or energy value of the digital audio signal Ms or the digital audio signal Se is found exceeding the predetermined threshold, the controller 224 starts up the sound leakage evaluating block 223.

(Timing 4)

Although not shown, the DSP 22 contains an FFT (Fast Fourier Transform) processing circuit configured to execute frequency analysis on a digital audio signal Ms and a digital audio signal Se and a decision circuit configured to made a decision whether a frequency amplitude value has gone over a predetermined threshold. The CPU monitors the output of the decision circuit. If the frequency amplitude value of the digital audio signal Ms or the digital audio signal Se is found exceeding the predetermined threshold, the controller 224 starts up the sound leakage evaluating block 223.

(Timing 5)

When a predetermined operation done by the listener is detected by the controller 224 of the DSP 22, the controller 224 starts up the sound leakage evaluating block 223. The detection of a predetermined operation by the listener can be realized by arranging an operation button on the audio signal processor 20, for example, and an operation of this button is detected by the controller 224. It is also practicable arrange detecting means configured to detect, from an audio signal from the microphone 12, the hitting (one or more hits) of the headphone housing 2 by the listener, the output of this detecting means being monitored by the CPU. If the hitting is found done by the listener, then the controller 224 starts up the sound leakage evaluating block 223.

In the present embodiment, with any of the above-mentioned timings 1 through 5, the sound leakage evaluating block 223 is started up. It is also practicable to start up the sound leakage evaluating block 223 with any one of the above-mentioned timing. It is still also practicable to extract two or more of the above-mentioned timings and start up the sound leakage evaluating block 223 with the extracted timings.

It should be noted that, with the audio signal Se, an error decision may be caused in a soundless interval between music tracks or other soundless intervals when the external listening environment is quiet, so that the sound leakage evaluating block 223 is not started up in these soundless intervals.

Figure 2:
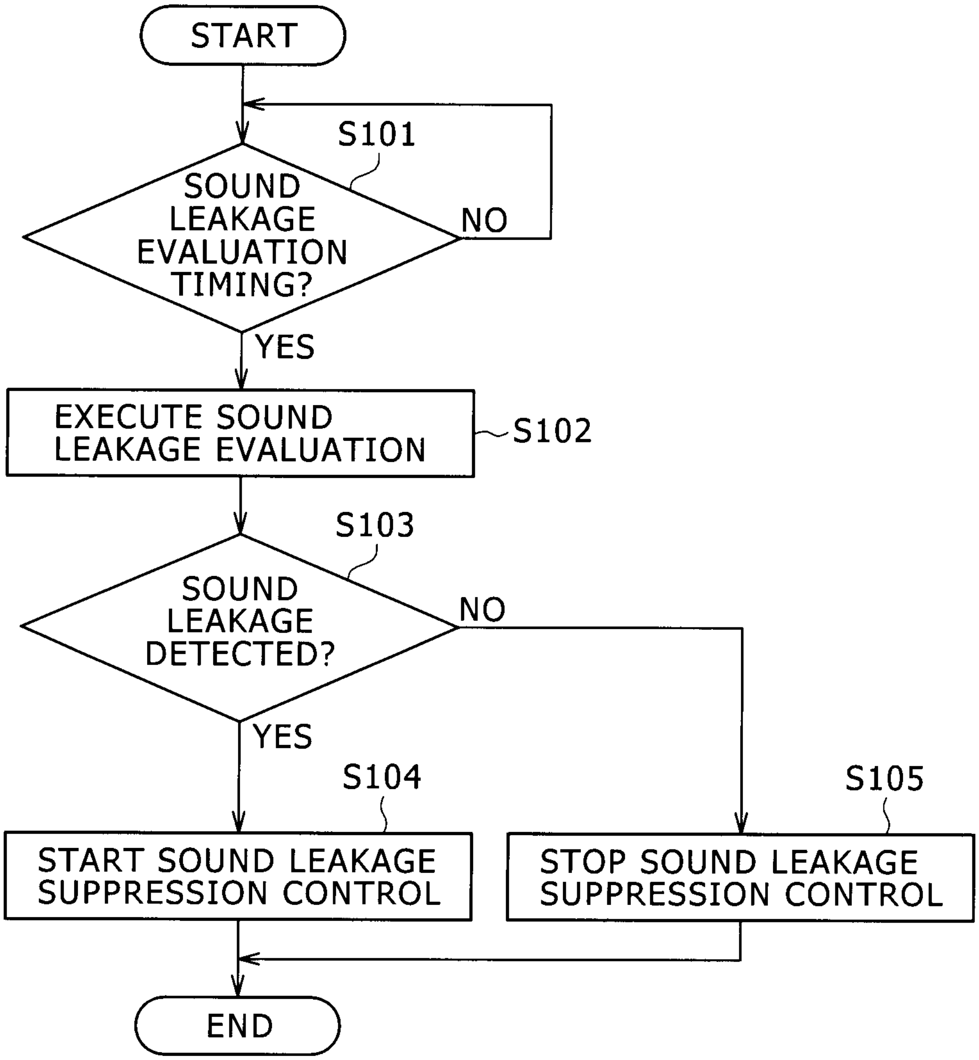
FIG. 2 is a flowchart indicative of an exemplary processing operation of a main portion of the headphone apparatus shown in FIG. 1.

FIG. 2 shows a flowchart indicative of timing control of the sound leakage processing executed by the controller 224 in the DSP 22.

First, the controller 224 checks any of the above-mentioned timings to determine whether a sound leakage evaluation timing has been reached (step S101). If a sound leakage evaluation timing is found reached, then the controller 224 starts up the sound leakage evaluating block 223 to execute sound leakage evaluation processing (step S102).

The sound leakage evaluating block 223 executes the sound leakage evaluation processing to determine whether a sound leakage has been recognized (step S103). If a sound leakage is recognized in step S103, then the sound leakage evaluating block 223 supplies a sound leakage suppression control execution signal to the sound leakage suppression controller 222, thereby starting sound leakage suppression control (step S104). If no sound leakage is recognized in step S103, the sound leakage evaluating block 223 supplies a sound leakage suppression control stop signal to the sound leakage suppression controller 222 to stop the sound leakage suppression control, thereby outputting the audio signal Se to the power amplifier 24 with the sound volume set by the listener left unchanged (step S105).

[Exemplary Configurations of the Sound Leakage Evaluating Block 223]

The following describes some exemplary configurations of the sound leakage evaluating block 223.

First Example

Figure 3:
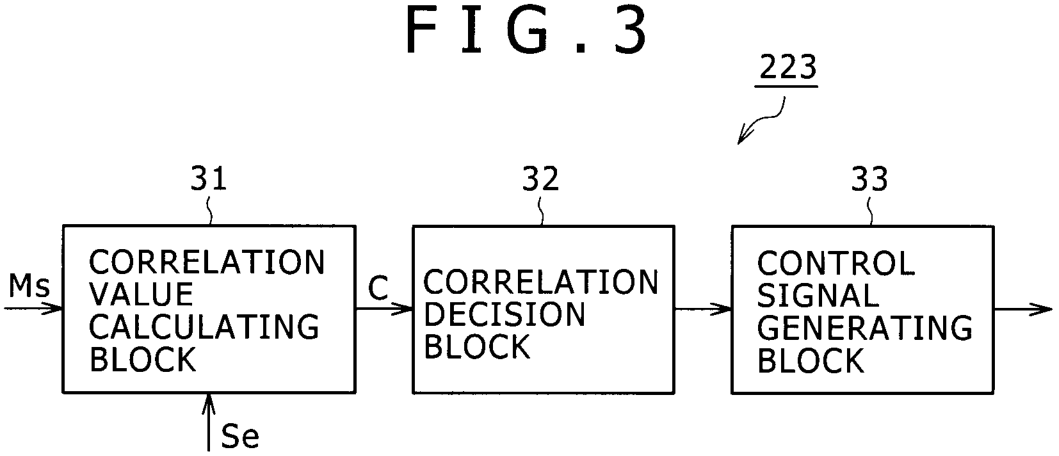
FIG. 3 is a block diagram illustrating an exemplary configuration of a main portion of the headphone apparatus shown in FIG. 1.

Referring to FIG. 3, there is shown a first exemplary configuration of the sound leakage evaluating block 223. In this example, the sound leakage evaluating block 223 is made up of a correlation value calculating block 31, a correlation decision block 32, and a control signal generating block 33.

The correlation value calculating block 31 calculates a mutual correlation calculation value (or a correlation value) between a digital audio signal Se and a digital audio signal Ms and supplies an obtained correlation value to the correlation decision block 32. The correlation decision block 32 determines whether a maximum value of correlation value C supplied from the correlation value calculating block 31 in a predetermined specified period is greater than predetermined threshold correlation value Cth. This specified period is equivalent to a period for 4096 samples for example if sampling frequency Fs of digital audio signal is 48 kHz for example.

If this maximum value of correlation value C is greater than predetermined threshold correlation value Cth, then the correlation decision block 32 determines that the correlation between digital audio signal Se and digital audio signal Ms is high and therefore the leakage sound is high, demanding sound leakage suppression. Then, the correlation decision block 32 supplies this decision result to the control signal generating block 33.

On the other than, if the maximum value of correlation value C is found to be smaller than predetermined threshold correlation value Cth in the above-mentioned specified period, then the correlation decision block 32 determines that the correlation between digital audio signal Se and digital audio signal Ms is low and therefore the sound picked up by the microphone 12 is mostly made up of an external noise component, indicating that the portable music player is located in a noisy listening environment. Consequently, the correlation decision block 32 determines that, although there is a noise leakage, sound leakage suppression need not be executed, supplying this decision result to the control signal generating block 33.

If sound leakage suppression is demanded on the basis of the decision result received from the correlation decision block 32, the control signal generating block 33 generates a sound leakage suppression start execution signal and outputs the generated signal to the sound leakage suppression controller 222; if sound leakage suppression is not demanded, the control signal generating block 33 generates a sound leakage suppression control stop signal and outputs the generated signal to the sound leakage suppression controller 222.

Consequently, in a listening environment demanding sound leakage suppression, the sound leakage suppression controller 222 executes sound leakage suppression and, when sound leakage suppression is demanded no more, stops sound leakage suppression control, thereby causing the audio signal Se to be reproduced through the driver 11 with the sound volume left set by the listener.

Second Example

Figure 4:
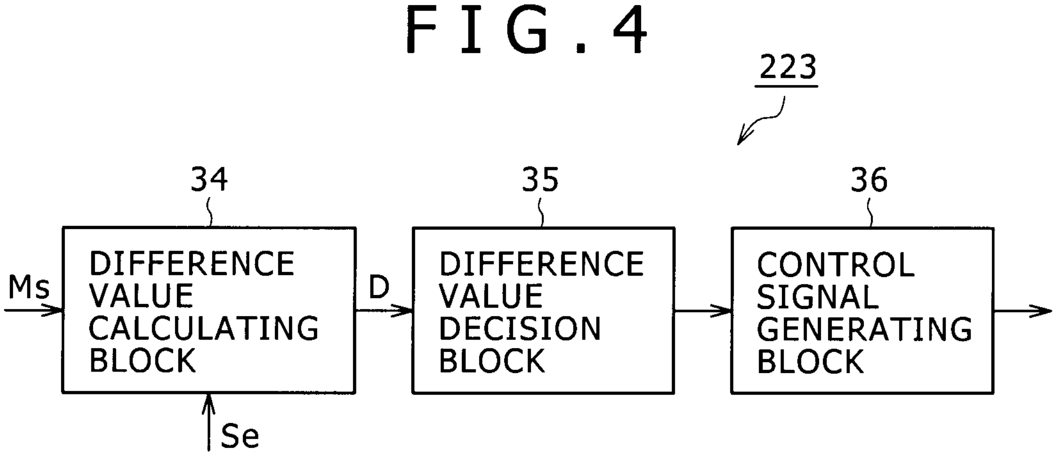
FIG. 4 is a block diagram illustrating another exemplary configuration of a main portion of the headphone apparatus shown in FIG. 1.

Referring to FIG. 4, there is shown a second exemplary configuration of the sound leakage evaluating block 223. In this example, the sound leakage evaluating block 223 is made up of a difference value calculating block 34, a difference value decision block 35, and a control signal generating block 36.

The difference value calculating block 34 subtracts a digital audio signal Se from a digital audio signal Ms to obtain a difference value and supplies an obtained difference value D to the difference value decision block 35. As with the first example, the difference value decision block 35 obtains an energy value of the difference value D in a predetermined specified period to determine whether the obtained energy value is greater than predetermined threshold Eth.

If the energy value of the difference value D in the specified period is found to be smaller than the predetermined threshold Eth, then, because a correlation between the digital audio signal Se and the digital audio signal Ms is high and therefore the leakage sound is high, the difference value decision block 35 determines that sound leakage suppression is demanded, supplying a decision result to the control signal generating block 33.

If the energy value of the difference value D in the specified period is found to be greater than the predetermined threshold value Eth, then the difference value decision block 35 determines that the correlation between digital audio signal Se and digital audio signal Ms is low and therefore the sound picked up by the microphone 12 is mostly made up of an external noise component, indicating that the portable music player is located in a noisy listening environment. Consequently, the difference value decision block 35 determines that, although there is a noise leakage, sound leakage suppression need not be executed, supplying this decision result to the control signal generating block 36.

On the basis of the decision result received from the difference value decision block 35, if sound leakage suppression is necessary, the control signal generating block 36 generates a sound leakage suppression start execution signal and outputs the generated signal to the sound leakage suppression controller 222; if sound leakage suppression is not demanded, the control signal generating block 36 generates a sound leakage suppression control stop signal and outputs the generated signal to the sound leakage suppression controller 222.

Consequently, in a listening environment demanding sound leakage suppression, the sound leakage suppression controller 222 executes sound leakage suppression and, when sound leakage suppression is demanded no more, stops sound leakage suppression control, thereby causing the audio signal Se to be reproduced through the driver 11 with the sound volume left set by the listener.

It should be noted that, if not the energy value of the difference value D in the predetermined specified period but the maximum amplitude value of the difference value D in this predetermined specified period is smaller than the predetermined threshold value, then the difference value decision block 35 may determine that the correlation between digital audio signal Se and digital audio signal Ms is high, demanding sound leakage suppression. If the maximum amplitude value of the difference value D in the specified period is greater than the predetermined threshold value, the difference value decision block 35 may determine that the correlation between digital audio signal Se and digital audio signal Ms is low, not demanding sound leakage suppression.

Third Example

Figure 5:
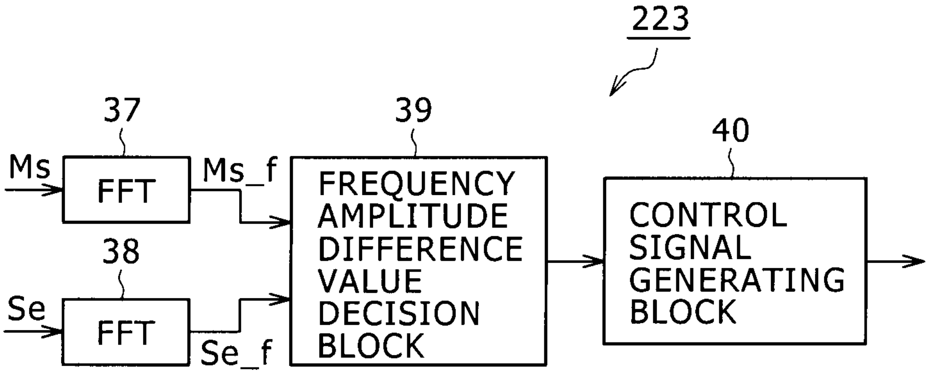
FIG. 5 is a block diagram illustrating still another example configuration of a main portion of the headphone apparatus shown in FIG. 1.

Referring to FIG. 5, there is shown a third exemplary configuration of the sound leakage evaluating block 223. In this example, a digital audio signal Se and a digital audio signal Ms are converted from time-domain signals into frequency-domain signals and a correlation between the converted signals is determined by comparison in the frequency domain.

In this third example, the sound leakage evaluating block 223 is made up of an FFT processing blocks 37, 38, a frequency amplitude difference value decision block 39, and a control signal generating block 40.

The FFT processing block 38 converts the digital audio signal Se in the specified period for example from time-domain signal into frequency-domain signal and supplies the converted frequency-domain signal Se_f to the frequency amplitude difference value decision block 39. Likewise, the FFT processing block 37 converts the digital audio signal Ms in the specified period for example from time-domain signal into frequency-domain signal and supplies the converted frequency-domain signal Ms_f to the frequency amplitude difference value decision block 39.

The frequency amplitude difference value decision block 39 makes a comparison between the frequency-domain signal Se_f and the frequency-domain signal Ms_f. In this example, the frequency amplitude difference value decision block 39 obtains a difference between signal Se and signal Ms for each frequency and uses the energy value or maximum amplitude value of the obtained difference as a parameter for the decision of correlation, thereby determining whether sound leakage suppression is demanded or not, as with the second example above. Then, the frequency amplitude difference value decision block 39 supplies a decision result to the control signal generating block 40.

On the basis of the decision result received from the frequency amplitude difference value decision block 39, if sound leakage suppression is found necessary, the control signal generating block 40 generates a sound leakage suppression start execution signal and outputs the generated signal to the sound leakage suppression controller 222; if sound leakage suppression is found not necessary, the control signal generating block 40 generates a sound leakage suppression control stop signal and supplies the generated signal to the sound leakage suppression controller 222.

Consequently, in a listening environment sound leakage suppression is necessary wherein, the sound leakage suppression controller 222 executes sound leakage suppression and, when sound leakage suppression is necessary no more, stops sound leakage suppression control, thereby causing the audio signal Se to be reproduced through the driver 11 with the sound volume left set by the listener.

In the third example, it is also practicable to increase an evaluation decision sensitivity for the frequency band (1 kHz to 3 kHz for example) in which sound leakage is easily caused in advance or reducing this sensitivity for low frequencies in which external noise is easily caused, for example.

[Exemplary Configurations of the Sound Leakage Suppression Controller 222]

In the sound leakage suppression control processing in the sound leakage suppression controller 222, sound volume reduction processing for lowering sound volume by a specified level; however, it is also practicable to use other means.

For example, if sound leakage suppression control is necessary, it is practicable to execute compressor processing or limiter processing such that the sound volume is prevented from going up over a predetermined level.

It is also practicable to execute control such that the above-mentioned frequency band (1 kHz to 3 kHz for example) noisy to others as sound leakage is lowered further.

Second Embodiment

In the second embodiment, the accuracies of sound leakage evaluation and decision are enhanced in the sound leakage evaluating block 223 in the first embodiment.

Figure 6:
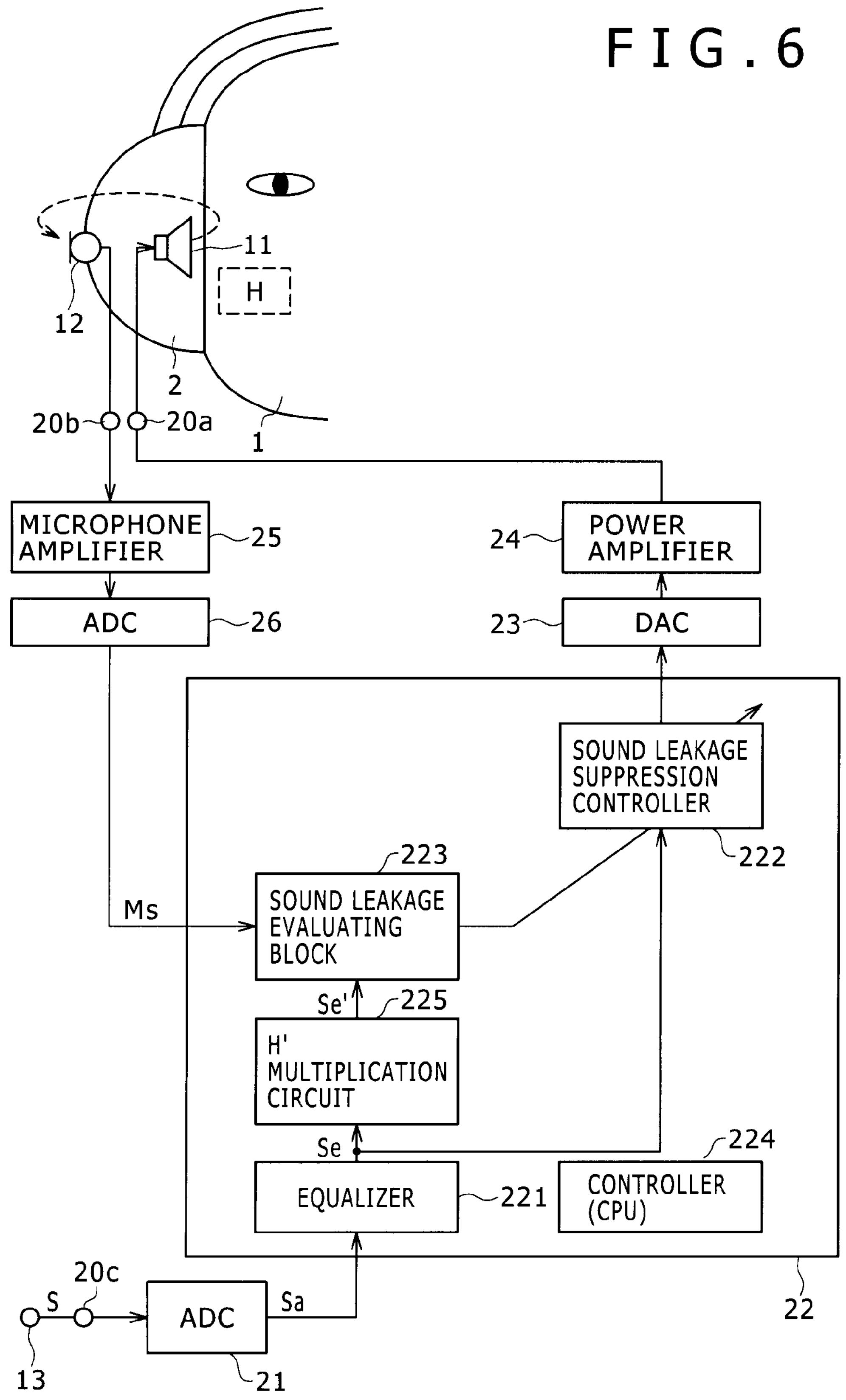
FIG. 6 is a block diagram illustrating an exemplary configuration of a second embodiment in which an audio output apparatus according to the second embodiment of the present invention is applied to a headphone apparatus.

As shown in FIG. 6, let a transmission function between a driver 11 of a headphone housing 2 and a microphone 12 external to the headphone housing 2 be H and the use of this transmission function H allows the estimation what time waveform the sound reproduced by the driver 11 is caused at the location of the microphone 12.

In the second embodiment, a signal to be compared with signal Ms by the sound leakage evaluating block 223 is not the signal Se itself, but a signal Se' generated to cause a reproduced sound at the location of the microphone 12 is used in consideration of the above-mentioned transmission function H.

This transmission function H may be handled as known by measuring beforehand. The transmission function H itself includes many resonances and reflections inside the headphone housing 2, thereby becoming complicated. Therefore, actually, in terms of the quantity of calculation, transmission function H' obtained by approximating the property of this transmission function H is used.

Namely, in the second embodiment, an output signal Se of digital equalizer 221 is supplied to an H' multiplication block 225 to be multiplied by transmission function H', thereby generating a signal Se'. This signal Se', as described above, corresponds to a sound leaked from the headphone housing 2 when the signal Se is reproduced by the driver 11 and is picked up by the microphone 12.

Then, the signal Se' supplied from the H' multiplication block 225 is supplied to the sound leakage evaluating block 223 to be compared with the signal Ms for checking correlation. The other configurations and processing operations are substantially the same as those of the first embodiment.

Configured as such, in the second embodiment, in a first exemplary configuration of the sound leakage evaluating block 223, a mutual correlation is calculated with the signal Se' that is about the same as a sound leakage component included in the signal Ms, so that the acquisition of a correlation value can be expected with higher accuracy, for example.

In a second exemplary configuration of the sound leakage evaluating block 223, it is practicable for a difference obtained by subtracting the signal Se' from the signal Ms to be only an external noise component picked up by the microphone 12, thereby enhancing the accuracy of sound leakage evaluation decision.

Further, in a third exemplary configuration of the sound leakage evaluating block 223, a comparison is made in frequency domain between the signal Ms and the signal Se' about the same as a sound leakage component included in the signal Ms, thereby enhancing the accuracy of sound leakage evaluation decision.

It should be noted that, in computation by use of transmission function H, impulse response h thereof is often computed by FIR (Finite Impulse Response). However, the FIR computation uses a lot of computation resources in the computation by the DSP and CPU. Therefore, in the second embodiment, transmission function H' obtained by approximating the property of the above-mentioned transmission function H is used and the H' multiplication block 225 is realized as a filter of IIR (Infinite Impulse Response), thereby circumventing the above-mentioned problem.

It is also practicable to use, instead of the H' multiplication block 225, a circuit configured to convolute impulse response h (associated with transmission function H') in time axis against signal Se in FIG. 6.

Third Embodiment

In the above-mentioned first and second embodiments, sound leakage is evaluated and determined for all frequency bands of signals Se and Ms; however, it is also practicable to execute sound leakage evaluation and determination limited only for the frequency band (1 kHz to 3 kHz for example) in which sound leakage is caused. In the third embodiment, this limitation is executed.

Figure 7:
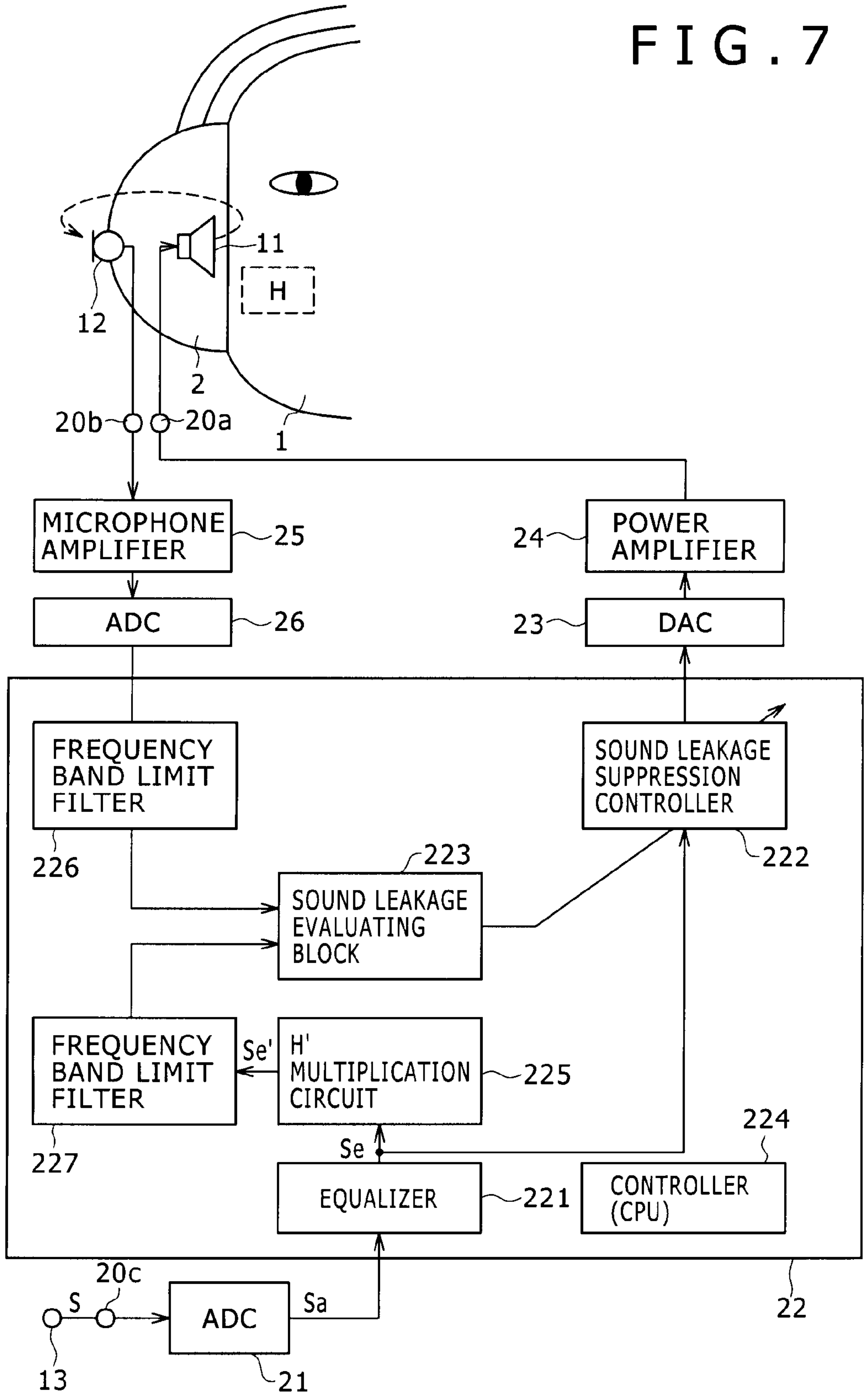
FIG. 7 is a block diagram illustrating an exemplary configuration of a third embodiment in which an audio output apparatus according to the third embodiment of the present invention is applied to a headphone apparatus.

Referring to FIG. 7, there is shown a block diagram illustrating an exemplary configuration of a headphone apparatus practiced as the third embodiment of the invention. As shown in FIG. 7, a digital audio signal Ms from an A/D converter 26 is supplied to a sound leakage evaluating block 223 via a frequency band limit filter 226 having a passing band of 1 kHz to 3 kHz for example. A digital audio signal Se' from an H' multiplication block 225 is supplied to the sound leakage evaluating block 223 via a frequency band limit filter 227 having a passing band of 1 kHz to 3 kHz for example.

The other configurations and processing operations are substantially the same as those of the first and second embodiments.

The third embodiment executes sound leakage suppression control when the leakage noise heard by others from the portable music player is high, thereby providing very high noise suppression effects.

Fourth Embodiment

In the above-mentioned first through third embodiments, when sound leakage is detected, sound leakage suppression control processing is executed on reproduced audio signal Se. It is also practicable for the listener who comes to be aware of sound leakage from the portable music player and to lower the sound volume for example on his own, thereby preventing sound leakage.

From this point of view, on the basis of a decision result from the sound leakage evaluating block 223 indicative whether sound leakage suppression is necessary, the fourth embodiment is configured to send an alarm message to the listener telling the occurrence of sound leakage and prompting the lowering of sound volume to minimize sound leakage, for example.

Figure 8:
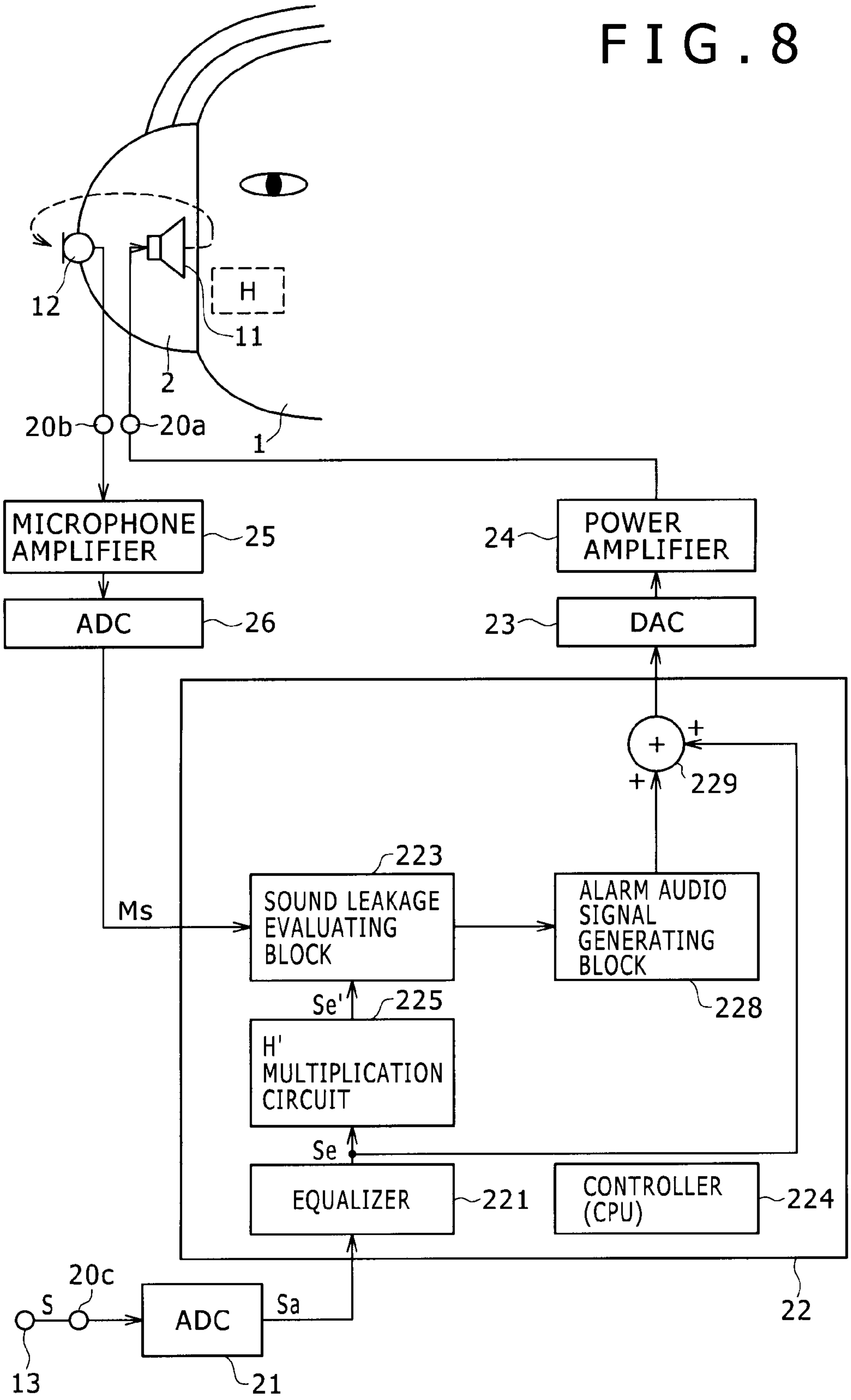
FIG. 8 is a block diagram illustrating an exemplary configuration of a fourth embodiment in which an audio output apparatus according to the fourth embodiment of the present invention is applied to a headphone apparatus.

Referring to FIG. 8, there is shown a block diagram illustrating an exemplary configuration of a headphone apparatus practiced as the fourth embodiment. In the fourth embodiment, an alarm audio signal generating block 228 is arranged instead of the sound leakage suppression controller 222. A decision result from the sound leakage evaluating block 223 whether sound leakage suppression is necessary is supplied to the alarm audio signal generating block 228 as an output control signal of this alarm sound.

The alarm audio signal generating block 228 is made up of memory storing audio messages such as “Sound leakage is occurring. Lower the volume” for example and a block for controlling the reading of this message, for example. This read control block controls the reading of alarm audio signals of audio messages in accordance with the decision result from the sound leakage evaluating block 223 whether sound suppression is necessary or not.

To be more specific, if the decision result from the sound leakage evaluating block 223 indicates that sound leakage suppression is necessary, the read control block of the alarm audio signal generating block 228 reads the corresponding alarm audio signal from the memory and supplies this signal to an adder 229.

If the decision result from the sound leakage evaluating block 223 indicates that sound leakage suppression is not necessary, then the read control block of the alarm audio signal generating block 228 stops reading the corresponding alarm audio signal or does not read this message from the memory. Therefore, the alarm audio signal is not supplied to the adder 229.

On the other hand, the signal Se from the digital equalizer 221 is directly supplied to the adder 229. Then, the output audio signal from the adder 229 is supplied to the D/A converter 23 to be supplied via the power amplifier 24 to the driver 11, being reproduced as sound.

In FIG. 8, the configuration and processing operation of the sound leakage evaluating block 223 and other configurations are substantially the same as those of the second embodiment.

Configured as such, if sound leakage suppression is found necessary by the sound leakage evaluating block 223, the fourth embodiment adds the alarm audio signal to the reproduced audio signal Se through the adder 229 and supplies the added signal to the driver 11 to be reproduced as sound.

When the listener accordingly executes an operation of lowering the sound volume for the reproduced audio signal Se, for example, it is determined that sound leakage suppression is not necessary, thereby stopping the reading of the alarm audio signal from the alarm audio signal generating block 228. If the listener does not execute the operation of lowering the sound volume for the reproduced audio signal Se and therefore the sound leakage evaluating block 223 determines that sound leakage control is necessary, the alarm message is kept outputted.

Consequently, according to the fourth embodiment, the listener executes an operation of preventing sound leakage, lowering the sound volume for example, in accordance with the alarm message, so that sound leakage can be suppressed indirectly.

It should be noted that, in the above description of the fourth embodiment, an alarm message is added to an audio signal Se to be supplied to the driver 11 for reproduction in sound; however, it is also practicable to give a sound leakage alarm to the listener with a buzzer alarm sound generated by a buzzer or a beep alarm sound generated by a beeper, for example, thereby prompting the listener to execute a sound leakage suppressing operation, instead of adding an alarm message to the audio signal Se.

It is also practicable to arrange a display block to display an alarm or flashing an alarm light indicative of the occurrence of sound leakage, instead of sounding an alarm message or an alarm sound.

Fifth Embodiment

In each of the headphone apparatuses of the first through fourth embodiments described above, an audio signal picked up by the microphone 12 arranged externally to the headphone housing 2 is used for sound leakage evaluation and determination along with a reproduced audio signal Se; however, it is also practicable to arrange this microphone 12 especially for the purpose of sound leakage evaluation and determination or share a microphone arranged for another purpose.

Figure 9:
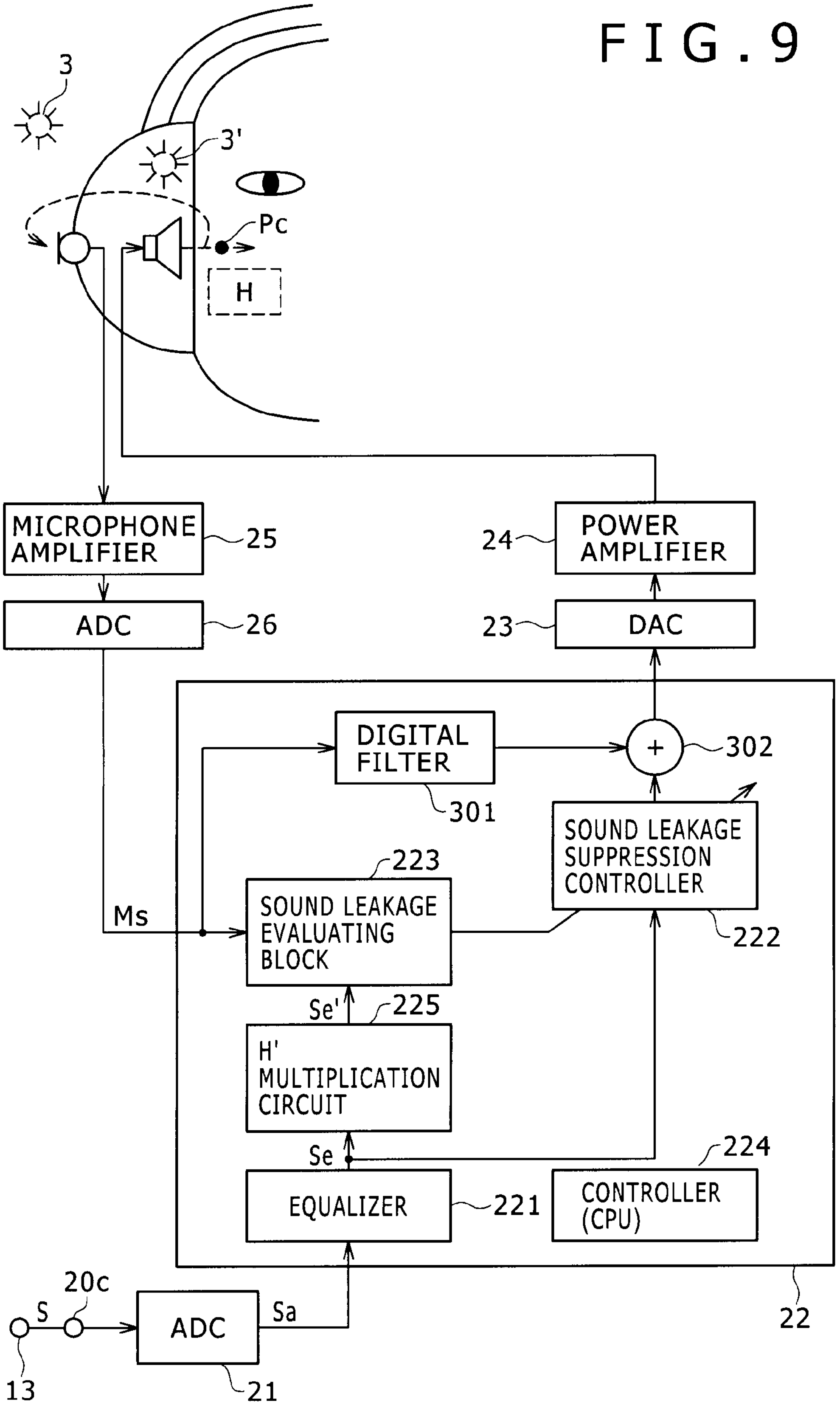
FIG. 9 is a block diagram illustrating an exemplary configuration of a fifth embodiment in which an audio output apparatus according to the fifth embodiment of the present invention is applied to a headphone apparatus.

Referring to FIG. 9, there is shown another embodiment (namely, the fifth embodiment) of a headphone apparatus, in which the microphone 12 is a microphone arranged to realize the noise reduction capability of feed forward type.

In this fifth embodiment, in an music listening environment of a listener 1, noise entering from a noise source 3 external to a headphone housing 2 into the music listening environment of the listener 1 inside the headphone housing 2 is reduced in a feed forward manner, thereby allowing the listener 1 to listen to music in a good listening environment.

Basically, as shown in FIG. 9, a noise reduction system of feed forward type executes proper filtering processing on noise 3 picked up by the microphone 12 arranged externally to the headphone housing 2 to generate a noise reduction audio signal and reproduces the generated noise reduction audio signal through a driver 11 in the headphone housing 2, thereby canceling the noise (noise 3') near the ear of the listener 1.

The noise 3 picked up by the microphone 12 and the noise 3' inside the headphone housing 2 have different properties according to the spatial difference between these noises. Therefore, in the feed forward type, a noise reduction audio signal is generated by taking into account the difference in space transmission function between the noise from the noise source 3 picked up by the microphone 12 and the noise 3' at noise cancel point Pc.

In the fifth embodiment, a digital filter 301 is used for a noise reduction audio signal generating block of feed forward type. This digital filter 301 is arranged inside the DSP 22. In this embodiment, a noise reduction audio signal is generated in a feed forward manner, so that the digital filter 301 is hereafter referred to as an FF filter 301.

Then, as shown in FIG. 9, the audio signal picked up by the microphone 12 is supplied to the A/D converter 26 through the microphone amplifier 25 to be converted into a digital audio signal Ms. Next, this digital audio signal Ms is supplied to the digital filter 301 in the DSP 22.

The digital filter 301 generates, from the digital audio signal Ms entered therein, the above-mentioned digital noise reduction audio signal having a property corresponding to a filter coefficient as a parameter to be set thereto. The DSP 22 has filter coefficients to be set to the digital filter 301 in advance.

The digital noise reduction audio signal generated by the digital filter 301 is supplied to an adder 302 to be added to the audio signal supplied from the sound leakage suppression controller 222, the resultant signal being supplied to the D/A converter 23 to be converted into an analog audio signal to be supplied to the driver 11 through the power amplifier 24.

This reproduced audio signal to be sounded from the driver 11 includes a sound reproduction component based on the noise reduction audio signal generated by the FF filter 301. Of the audio signal reproduced and sounded by the driver 11, the sound reproduced component based on the noise reduction audio signal and the noise 3' are combined in sound to reduce (or cancel) the noise 3' at noise cancel point Pc.

Circuit portions, such as a sound leakage evaluating block and so on in the DSP 22, is indicated with the second embodiment applied in the example shown in FIG. 9. These circuit portions execute the substantially the same processing operations as those of the second embodiment.

According to the fifth embodiment, a microphone for another capability can be shared as the microphone 12, so that the fifth embodiment is advantageous that no new microphone need be arranged for the purpose of sound leakage evaluation decision.

It should be noted that the microphone for another capability is not limited to the noise reduction capability of feed forward type as described in the above-mentioned example.

For example, a microphone for noise pickup in a adaptive noise cancel system may be used.

It is also practicable to use a microphone arranged to temporarily listen to external sound with a headphone kept worn.

If a headphone apparatus is for a wireless communications terminal having an audio reproduction capability and a pickup microphone for executing audio communication with others is arranged on this headphone apparatus, this microphone can be used as the microphone 12. In this case, the headphone apparatus includes a so-called head set.

Sixth Embodiment

In the above-described embodiments, an audio signal is converted into a digital signal and digital processing is executed on the obtained digital signal; however, it is also practicable to realize these embodiments in analog configurations.

Figure 10:
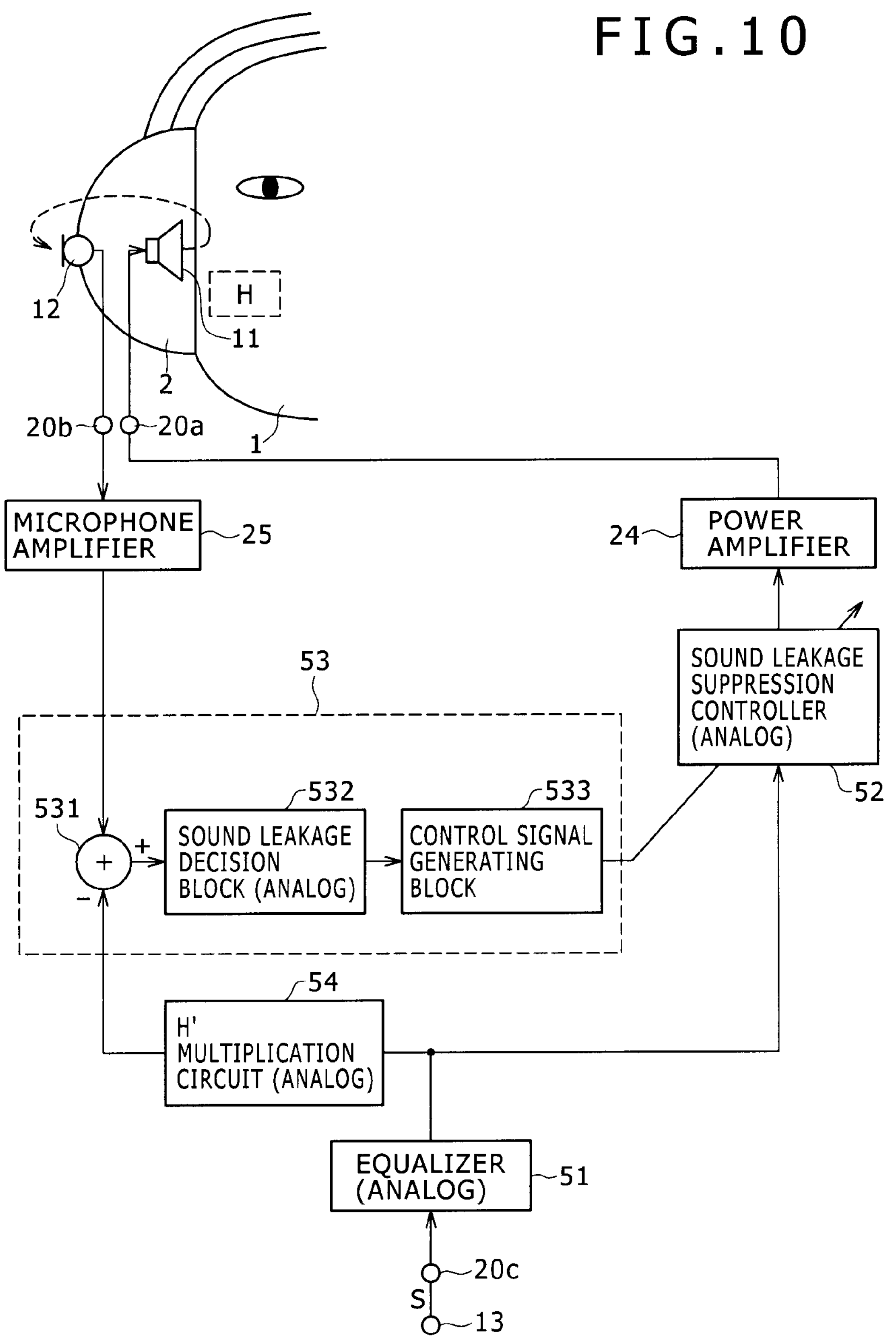
FIG. 10 is a block diagram illustrating an exemplary configuration of a sixth embodiment in which an audio output system according to the sixth embodiment of the present invention is applied to a system composed of a headphone apparatus and a portable music player.

The sixth embodiment shown in FIG. 10 has an analog configuration in which a headphone apparatus is realized in an analog approach.

To be more specific, in the sixth embodiment, an audio signal S entered through an audio signal input terminal 13 is supplied to a sound leakage suppression controller 52 based on analog circuitry through an analog equalizer 51. This sound leakage suppression controller 52 is configured by analog circuitry that reduces the gain of an audio signal supplied thereto, thereby lowering sound volume, for example.

An output signal from the analog equalizer 51 is multiplied by transmission function H' by an H' multiplication circuit 54 having an analog processing configuration (an analog filter configuration for example) and a resultant signal is supplied to the sound leakage evaluating block 53 having an analog processing configuration. An audio signal from the microphone 12 is supplied to the sound leakage evaluating block 53 through a microphone amplifier 25.

In this example, the sound leakage evaluating block 53 corresponds to that of the second example shown above, having a subtractor 531, a sound leakage decision block 532 based on analog processing configuration, and a control signal generating block 533 based on analog processing configuration.

The sound leakage decision block 532 is made up of a circuit configured to integrate the difference signal from the subtractor 531 over the specified period as described above to obtain an energy value in this specified period and a comparator for making a comparison between the obtained energy value and a threshold value.

The control signal generating block 533 can be configured as a circuit that generates a control signal from a comparison output signal of the comparator of the sound leakage evaluating block 53. Namely, if the comparison output signal is indicative that the obtained energy value is smaller than the threshold value, the control signal generating block 533 determines that sound leakage suppression is necessary, thereby outputting a high-level signal for example; if the comparison output signal is indicative that the obtained energy value is greater than the threshold value, the control signal generating block 533 determines that sound leakage suppression is not necessary, thereby outputting a low-level signal for example.

If the signal from the sound leakage evaluating block 53 is high, then the sound leakage suppression controller 52 lowers the gain of an audio signal supplied thereto to lower the sound volume; if the signal from the sound leakage evaluating block 53 is low, the sound leakage suppression controller 52 sets the gain of an audio signal supplied thereto to "1" to output the signal with the gain left unchanged.

It should be noted that the configuration shown in FIG. 10 is illustrative only; therefore, of the above-mentioned digital embodiments, those that can be replaced by analog processing circuits can have analog configurations.

Seventh Embodiment

In the above-mentioned embodiments, the audio signal processor 20 is arranged on a headphone apparatus and sound leakage evaluation and sound leakage suppression control are executed by the audio signal processor 20. It is also practicable to arrange an audio processing circuit similar to that mentioned above onto an audio output device side, such as a portable music player to which the headphone apparatus is connected, rather than arranging the audio signal processor 20 on the headphone apparatus side. This configuration is realized by the seventh embodiment of the invention.

Figure 11:
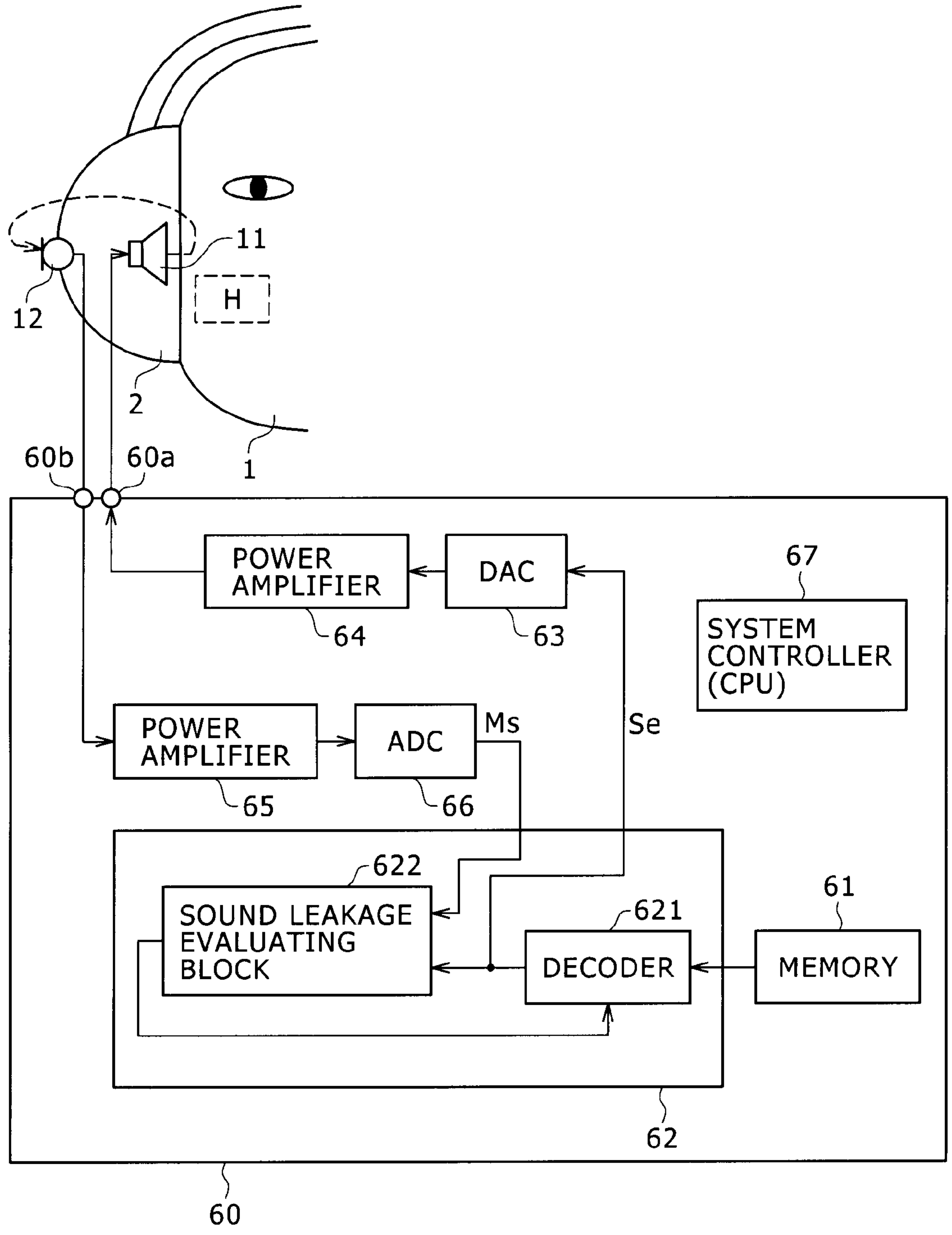
FIG. 11 is a block diagram illustrating an exemplary configuration of a seventh embodiment in which an audio output apparatus according to the seventh embodiment of the present invention is applied to a headphone apparatus.

Referring to FIG. 11, there is shown a block diagram illustrating a configuration practiced as the seventh embodiment of the invention. FIG. 11 shows an exemplary audio output system made up of a headphone apparatus having a driver 11 and a microphone 12 and a portable music player 60.

In this example, the portable music player 60 has a terminal **60*a* for supplying an audio signal to the driver 11 of the headphone apparatus and a terminal 60*b* for receiving a pickup audio signal from the microphone 12. These terminals 60*a* and 60*b*** are each made up of plug and jack.

In the portable music player 60 of this embodiment, music data to be reproduced is stored in a memory 61. The music data is read from the memory 61 under the control of a system controller 67 in accordance with a music select signal entered through an operator block, not shown. In this example, the music data is digital-equalized and decompressed for example by a decoder 621 in the DSP 62 to provide music data Se.

Then, the decoded music data Se is supplied to a sound leakage evaluating block 622 in the DSP 62 and, at the same time, converted into an analog audio signal by a D/A converter 63 to be supplied to the driver 11 of the headphone apparatus through the power amplifier 64 to be reproduced in sound.

The pickup audio signal from the microphone 12 is supplied to an A/D converter 66 through a microphone amplifier 65 of the portable music player 60 to be converted into a digital audio signal Ms. Then, the digital audio signal Ms from the A/D converter 66 is supplied to the sound leakage evaluating block 622 in the DSP 62.

The sound leakage evaluating block 622 is configured in substantially the same manner as the above-mentioned sound leakage evaluating block 223; namely, the sound leakage evaluating block 622 makes a comparison between the digital audio signal Se supplied thereto and a digital audio signal Ms to determine whether there is a correlation between the two signals, thereby generating information about a decision result indicative whether sound leakage suppression control is necessary or not as described before. Next, the sound leakage evaluating block 622 sends the generated decision result information to a sound leakage suppression controller arranged in the decoder 621, thereby causing the decoder to execute the sound leakage suppression control processing as described above.

Therefore, sound leakage control is executed in this seventh embodiment in substantially the same manner as in the above-mentioned first through fifth embodiments.

It should be noted that the exemplary configuration in the DSP 62 in the example shown in FIG. 11 is shown in a simplified manner; therefore, obviously, the configuration shown in FIG. 11 can be similar to the configuration in the DSP 223 in each of the above-mentioned first through fifth embodiments.

Other Embodiments and Variations

In the above-mentioned embodiments, the audio signals Se and Ms for a predetermined specified period are evaluated and determined for sound leakage and sound leakage control is executed according to a result of the determination. It is also practicable to repeat the sound leakage evaluation and determination for the audio signals Se and Ms for the specified period over two or more specified periods and, if obtained evaluation results are the same, execute sound leakage suppression control according to that same evaluation decision result. Alternatively, it is practicable to repeat the sound leakage evaluation and determination of the audio signals Se and Ms for the specified period over two or more specified periods to execute sound leakage suppression control on the basis of a predominant evaluation decision result of those of the two or more specified periods.

It should be noted that, if an external noise component is determined to be dominant and this external noise component is large, the sound volume of the signal Se to be reproduced may be raised.

It should be noted that the sound pickup means includes not only a microphone as a sound-electricity conversion means, but also a vibration sensor as vibration-electricity conversion means.

In the description of each of the above-mentioned embodiments, the audio signal processor 20 configured to execute sound leakage evaluation processing and sound leakage suppression control processing is made up of a DSP. It is also practicable to execute the processing of these audio processing circuits in a software approach by use of a microcomputer (or a microprocessor) instead of the DSP.

In the above-described embodiments, the audio output apparatus practiced as embodiments of the invention is a headphone apparatus. This audio output apparatus is also applicable to an earphone apparatus having a microphone, a head set apparatus, and a communications terminal such as a mobile phone, for example. In addition, as described above, the audio output apparatus practiced as embodiments of the invention is applicable to a portable music player based on a combination of a headphone, an earphone, and a head set, for example.

It should be understood by those skilled in the art that various modifications, combinations, sub-combinations and alternations may occur depending on design requirements and other factors insofar as they are within the scope of the appended claims or the equivalent thereof.

What is claimed is:

1. An audio output apparatus, comprising:

an electricity-to-sound converter arranged in a housing and configured to reproduce a sound according to a first audio signal;

a sound collector configured to pick up a sound outside said housing and output a second audio signal;

a first frequency band limit filter that filters the second audio signal;

a sound leakage evaluating block configured to evaluate a leakage of a sound reproduced by said electricity-to-sound converter into the outside of said housing on the basis of said first audio signal and said filtered second audio signal;

a multiplier configured to multiply said first audio signal by a coefficient approximating a transmission characteristic between said electricity-to-sound converter and said sound collector when the sound reproduced and outputted by said electricity-to-sound converter leaks outside said housing to be picked up by said sound collector;

a second frequency band limit filter that filters the multiplied first audio signal and supplies the filtered first audio signal to the sound leakage evaluating block, the first frequency band limit filter and the second frequency band limit filter having passing bands of 1 kHz to 3 kHz; and a controller configured to execute a predetermined processing on the basis of a result of an evaluation made by said sound leakage evaluating block.

2. The audio output apparatus according to claim 1, wherein said controller suppresses the leakage into the outside of said housing of the sound reproduced by said electricity-to-sound converter from said first audio signal.

3. The audio output apparatus according to claim 1, wherein said controller gives an alarm on the basis of the result of the evaluation made by said sound leakage evaluating block.

4. The audio output apparatus according to claim 1, wherein said sound leakage evaluating block makes a comparison between said first audio signal and said second audio signal to determine a correlation between said first and second audio signals and evaluate a sound leakage from said housing on the basis of a result of said correlation.

5. The audio output apparatus according to claim 1, wherein said sound leakage evaluating block has a correlation value calculating block configured to calculate a correlation value between said first audio signal and said second audio signal, and a correlation decision block configured to decide whether a sound is leaking outside said housing on the basis of said correlation value.

6. The audio output apparatus according to claim 1, wherein said sound leakage evaluating block obtains a difference between said first audio signal and said second audio signal to evaluate whether a sound is leaking outside said housing on the basis of the obtained difference.

7. The audio output apparatus according to claim 1, wherein said sound leakage evaluating block converts said first audio signal and said second audio signal in a time domain into a third signal and a fourth signal in a frequency domain and makes a comparison between said third signal and said fourth signal to evaluate whether a sound is leaking outside said housing.

8. The audio output apparatus according to claim 1, wherein said controller lowers a sound reproduction volume of said first audio signal.

9. The audio output apparatus according to claim 1, wherein said controller executes at least one of a compressor processing and a limiter processing on said first audio signal by defining an upper limit of the at least one of the compressor processing and the limiter processing.

10. The audio output apparatus according to claim 1, wherein said sound leakage evaluating block executes said evaluation when at least one of an instantaneous amplitude value and an energy value of at least one of said first audio signal and said second audio signal has been exceeded.

11. The audio output apparatus according to claim 1, wherein said sound leakage evaluating block executes said evaluation when, by executing a frequency analysis on at least one of said first audio signal and said second audio signal, a resultant frequency amplitude value has exceeded a predetermined level.

12. The audio output apparatus according to claim 1, wherein said sound leakage evaluating block executes said evaluation when at least one of an instantaneous amplitude value and an energy value of at least one of said first audio signal and said second audio signal has been exceeded and when, by executing a frequency analysis on at least one of said first audio signal and said second audio signal, a resultant frequency amplitude value has exceeded a predetermined level.

13. The audio output apparatus according to claim 1, further comprising:

a noise reducer configured to generate a noise reduction audio signal for reducing a noise outside said housing from said second audio signal picked up by said sound collector and add the generated noise reduction audio signal to said first audio signal.

14. The audio output apparatus according to claim 1, wherein the multiplier multiplies said first audio signal by the coefficient before the second frequency band limit filter filters the multiplied first audio signal.

15. The audio output apparatus according to claim 1, wherein the multiplier multiplies said first audio signal by the coefficient to produce a product, the second frequency band limit filter filters the product to produce a filtered signal, and the sound leakage evaluating block evaluates the leakage on the basis of the filtered signal.

16. An audio output method, comprising:

reproducing a sound according to a first audio signal, by an electricity-to-sound converter arranged in a housing;

picking up a sound outside said housing by a sound collector to output a second audio signal;

filtering, with a first frequency band limit filter, the second audio signal;

evaluating a leakage of a sound reproduced by said electricity-to-sound converter into the outside of said housing on the basis of said first audio signal and said filtered second audio signal;

multiplying said first audio signal by a coefficient approximating a transmission characteristic between said electricity-to-sound converter and said sound collector when the sound reproduced and outputted by said electricity-to-sound converter leaks outside said housing to be picked up by said sound collector;

filtering, with a second frequency band limit filter, the multiplied first audio signal, wherein the filtered first audio signal is supplied to the evaluating, the first frequency band limit filter and the second frequency band limit filter having passing bands of 1 kHz to 3 kHz; and executing a predetermined processing on the basis of a result of the evaluating.

17. A non-transitory recording media configured to record a computer-readable program for making a computer execute a method comprising:

reproducing a sound according to a first audio signal, by an electricity-to-sound converter arranged in a housing;

picking up a sound outside said housing by a sound collector to output a second audio signal;

filtering, with a first frequency band limit filter, the second audio signal;

evaluating a leakage of a sound reproduced by said electricity-to-sound converter into the outside of said housing on the basis of said first audio signal and said filtered second audio signal;

multiplying said first audio signal by a coefficient approximating a transmission characteristic between said electricity-to-sound converter and said sound collector when the sound reproduced and outputted by said electricity-to-sound converter leaks outside said housing to be picked up by said sound collector;

filtering, with a second frequency band limit filter, the multiplied first audio signal, wherein the filtered first audio signal is supplied to the evaluating, the first frequency band limit filter and the second frequency band limit filter having passing bands of 1 kHz to 3 kHz; and executing a predetermined processing on the basis of a result of the evaluating.

18. An audio output system, comprising:

a headphone apparatus; and an audio output apparatus to which said headphone apparatus is connected, said headphone apparatus including an electricity-to-sound converter arranged in a housing of said headphone apparatus and configured to reproduce a sound according to a first audio signal supplied from said audio output apparatus, and a sound collector configured to pick up a sound outside said housing of said headphone apparatus, said audio output apparatus including a sound leakage evaluating block configured to evaluate a leakage of a sound reproduced by said electricity-to-sound converter into the outside of said housing on the basis of said first audio signal to be supplied to said headphone apparatus and a second audio signal picked up by said sound collector, a first frequency band limit filter that filters the second audio signal, a multiplier configured to multiply said first audio signal by a coefficient approximating a transmission characteristic between said electricity-to-sound converter and said sound collector when the sound reproduced and outputted by said electricity-to-sound converter leaks outside said housing to be picked up by said sound collector, a second frequency band limit filter that filters the multiplied first audio signal and supplies the filtered first audio signal to the sound leakage evaluating block, the first frequency band limit filter and the second frequency band limit filter having passing bands of 1 kHz to 3 kHz, and a controller configured to execute a predetermined processing on the basis of a result of a sound leakage evaluation executed by said sound leakage evaluating block.

19. An audio output apparatus, comprising:

electricity-to-sound converting means arranged in a housing and for reproducing a sound according to a first audio signal;

sound collecting means for picking up a sound outside said housing and for outputting a second audio signal;

means for filtering the second audio signal;

sound leakage evaluating means for evaluating a leakage of a sound reproduced by said electricity-to-sound converting means into the outside of said housing on the basis of said first audio signal and said filtered second audio signal;

means for multiplying said first audio signal by a coefficient approximating a transmission characteristic between said electricity-to-sound converting means and said sound collecting means when the sound reproduced and outputted by said electricity-to-sound converting means leaks outside said housing to be picked up by said sound collecting means;

means for filtering the multiplied first audio signal and for supplying the filtered first audio signal to the sound leakage evaluating means, the means for filtering the multiplied first audio signal and the means for filtering the second audio signal having passing bands of 1 kHz to 3 kHz; and controlling means for executing a predetermined processing on the basis of a result of an evaluation made by said sound leakage evaluating means.

* * * * *